United States Patent [19]
Chesire et al.

[11] Patent Number: 5,264,377
[45] Date of Patent: Nov. 23, 1993

[54] INTEGRATED CIRCUIT ELECTROMIGRATION MONITOR

[75] Inventors: Daniel P. Chesire, Slatington; Anthony S. Oates, Bethlehem, both of Pa.

[73] Assignee: AT&T Bell Laboratories, Murray Hill, N.J.

[21] Appl. No.: 864,207

[22] Filed: Apr. 3, 1992

Related U.S. Application Data

[63] Continuation of Ser. No. 497,467, Mar. 21, 1990, abandoned.

[51] Int. Cl.$^5$ .............................................. H01L 21/66
[52] U.S. Cl. ...................................... 437/8; 437/170; 437/957
[58] Field of Search ......................... 437/8, 170, 957

[56] References Cited

U.S. PATENT DOCUMENTS

Re. 32,625  3/1988  Schwarz et al. .............. 374/57

FOREIGN PATENT DOCUMENTS

| 0112998 | 7/1984 | European Pat. Off. ........... 437/8 |
| 0253746 | 1/1988 | European Pat. Off. . |
| 57-201040 | 12/1982 | Japan ................................. 437/8 |
| 59-57445 | 4/1984 | Japan ................................. 437/8 |
| 64-8639 | 1/1989 | Japan ................................. 437/8 |
| 8802182 | 3/1988 | World Int. Prop. O. . |

OTHER PUBLICATIONS

Blake et al., "Test Site Technology in Integrated Circuits", IBM Tech. Disc. Bull., vol. 10, No. 2, Jul. 1967, p. 168.

American Society for Testing and Materials, "Standard Guide for Design of Flat, Straight-Line Test Structures for Detecting Metallization Open-Circuit or Resistance-Increase Failure Due to Electromigration", Designation F 1259-89 (Annual Book of ASTM Standards, vol. 10.04), 1989.

Proceedings of the IEEE International Reliability Physics Symposium (1985), pp. 100-107.

"Step Spacing Effects on Electromigration", by A. S. Oates; to be published in the Proceedings of the IEEE International Reliability Physics Symposium (1990).

*Primary Examiner*—Olik Chaudhuri
*Assistant Examiner*—Ourmazd S. Ojan
*Attorney, Agent, or Firm*—James H. Fox

[57] ABSTRACT

The electromigration characteristics of integrated circuit conductors are determined by passing a high current for a short period of time through an inventive test structure. This provides a rapid test in a more accurate manner than with the prior art SWEAT (Standard Wafer-level Electromigration Accelerated Test) structure. The test results have been found to be well correlated with long-term low current electromigration tests. A sensitive differential test may be implemented that determines the effects of topography features. The inventive test technique can be performed on every wafer lot, or even every wafer, so that adjustments to the wafer fabrication process can be rapidly implemented.

28 Claims, 4 Drawing Sheets

INTEGRATED CIRCUIT ELECTROMIGRATION MONITOR

This application is a continuation of application Ser. No. 07/497,467, filed on Mar. 21, 1990, now abandoned.

BACKGROUND OF THE INVENTION

1. Field of the Invention

The present invention relates to an improved test structure and method for determining the electromigration characteristics of integrated circuits.

2. Description of the Prior Art

The high reliability of integrated circuits is a very significant factor in their production and use. Attempts are made to ensure high reliability in all stages of the production process. Where feasible, tests are performed at intermediate stages of production so that corrective action can be taken if necessary. The importance of this procedure can be understood when it is realized that modern IC production requires hundreds of steps in very carefully controlled environmental conditions. The completion of all the steps for a given wafer typically requires several weeks, or even months, before the final IC wafer is available for electrical testing of its circuits. Therefore, a large inventory of very valuable product is undergoing processing at any given time. If a problem develops at a process step, it may, under worst-case conditions, be several weeks before it is discovered, thereby resulting in a significant economic loss of wafers in process.

One area of traditional concern is the electromigration characteristics of metal (e.g., aluminum, aluminum alloys, and/or refractory metal) conductors in the integrated circuit. Because of the very small linewidths required for present-day IC's, the current density in these conductors, including runners and contacts, is very high, often exceeding $1 \times 10^5$ amps/cm$^2$ in normal device operation. Therefore, if the metal is inadvertently thinner (or narrower) in some portions of the runner than in others, the current density will be even higher than the intended value at those locations. Since the failure rate due to electromigration problems increases rapidly as the current density increases, such unintended thinning of the runners may lead to unacceptable reliability of the IC. Still other factors may affect the electromigration characteristics, such as the presence of impurities or precipitates in the metal that forms the runners, the grain size of the metal, and various other geometry limiting effects.

The traditional means for determining the electromigration characteristics, and hence reliability, of the runners is to pass a current through a test structure on an IC wafer, and determine the time it takes for the test structure to fail. The failure may occur, for example, by the test conductor becoming non-conductive, or by one test conductor shorting out to another test conductor. A traditional test structure adopted by the National Bureau of Standards is shown in FIG. 4. A long, thin metal test conductor (400) is connected to broader metal conductors (401, 402) at either end, which connect to bondpads (403, 404) for supplying current from an external power supply. The length L of the test conductor is 800 micrometers, and the width of the broader metal conductors ($W_3$) is twice that of the test conductor ($W_4$). Voltage monitor test points are provided by conductors 405, 406, spaced $L_t = 2 \times W_3$ from the ends of regions 401, 402, and connected to bondpads (407, 408). It is also known in the art to include side conductors (not shown) to determine by means of a short-circuit test whether metal migration occurs transversely to the test conductor.

The current density in the long-term test is typically about 1 to $3 \times 10^6$ amps/cm$^2$. In addition, the long-term test provides for the wafer to be heated to approximately 200 to 300 C. in order to accelerate the test as much as possible. However, even under these conditions the traditional long-term test requires typically a week or more of operation without a failure to prove that the electromigration characteristics are satisfactory.

A more recent electromigration test technique is termed "SWEAT" (Standard Wafer-level Electromigration Acceleration Test), which provides for passing a much larger current than used for the "long-term" test through a test structure that is optimized for the accelerated test. The large current provides for joule heating of the test conductor only, which avoids the necessity for heating the entire wafer. The time required for the SWEAT test is typically only about 30 seconds at a current density of about 1 to $2 \times 10^7$ amps/cm$^2$ for an aluminum runner. Therefore, SWEAT could potentially be used for monitoring wafer lots in real time, in the sense that the information gained is sufficiently timely that the process parameters can be changed before the next lot arrives at a given process stage. If desired, testing can even be accomplished on each wafer, with appropriate process changes being accomplished before the next wafer. The SWEAT technique is described in "Wafer Level Electromigration Tests for Production Monitoring", B. J. Root et al, in the *Proceedings of the International Reliability Physics Symposium*, pp. 100–107 (1985).

The test structure used for the SWEAT test is shown in FIG. 3. The current is conducted from bondpads 301, 302 into the test structure through relatively wide end conductors 303 and 310. A plurality of relatively wide interior regions (304 . . . 309) alternate with relatively narrow regions (311 . . . 316). The width of the narrow regions is typically the same as the narrowest linewidth of the metal runners of the integrated circuits on the same wafer as the test structure. The alternation of the wide regions with narrow regions provides for abrupt thermal stress gradients that are thought necessary for the accelerated test. However, the SWEAT test has not been widely adopted in the semiconductor industry. This appears to be due to a lack of correlation between the results produced by SWEAT and the results produced by the more traditional long-term tests. Therefore, there is a need for an accelerated test technique that more accurately simulates the traditional long-term test, and hence give greater confidence as to its ability to accurately predict electromigration characteristics in actual device operation.

SUMMARY OF THE INVENTION

We have invented an improved technique of determining the electromigration characteristics of integrated circuit conductors. A test current is produced in a test structure that includes an elongated test conductor at least 50 micrometers long. The test conductor is contacted at both ends by conductor regions at least 5 times wider than the test conductor, and which taper down to the width of the test conductor at a taper angle $\theta$. In one embodiment, a high current density (at least $5 \times 10^6$ amps/cm$^2$) is produced in the test structure, allowing for a rapid determination of electromigration effects, so that the results may be used to change the processing conditions on a given wafer or wafer lot, if desired. A sensitive differential test using two test structures may be implemented to determine the effects of topography features.

DETAILED DESCRIPTION

Figure 3:
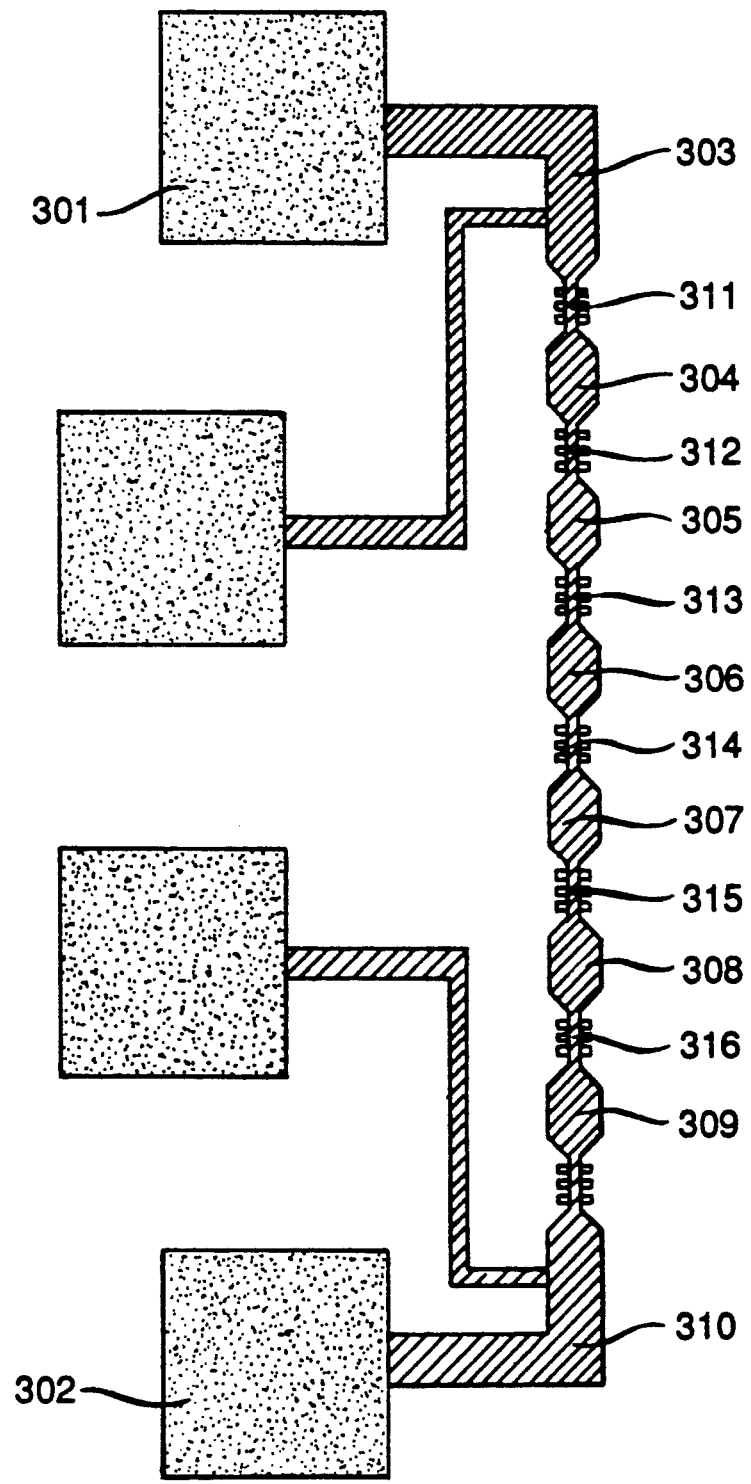
FIG. 3 shows a prior art test structure for implementing the SWEAT test.
Figure 4:
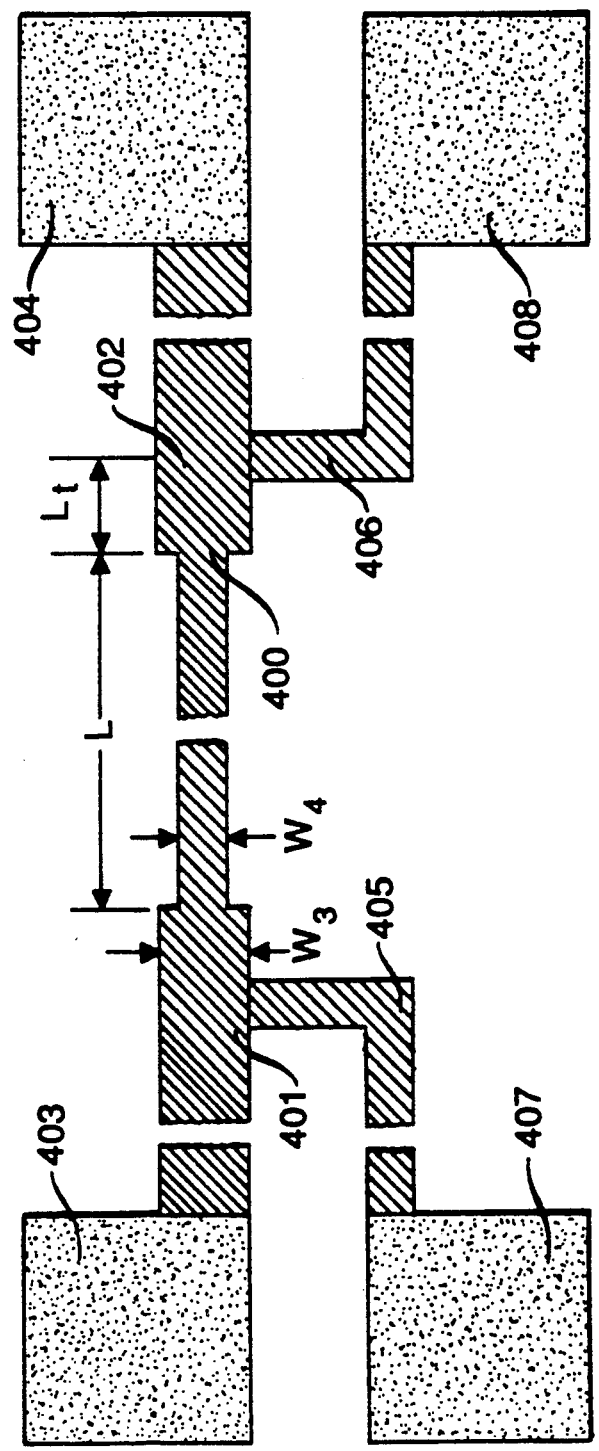
FIG. 4 shows a prior art test structure for implementing the long-term test.

The present detailed description relates to an improved method of rapidly performing an electromigration test. The results obtained may be used to change process conditions in an integrated circuit production line. The present invention includes the use of a test structure that produces results that more closely correlate with long-term test results than those produced by the standard SWEAT structure (FIG. 3).

Figure 1:
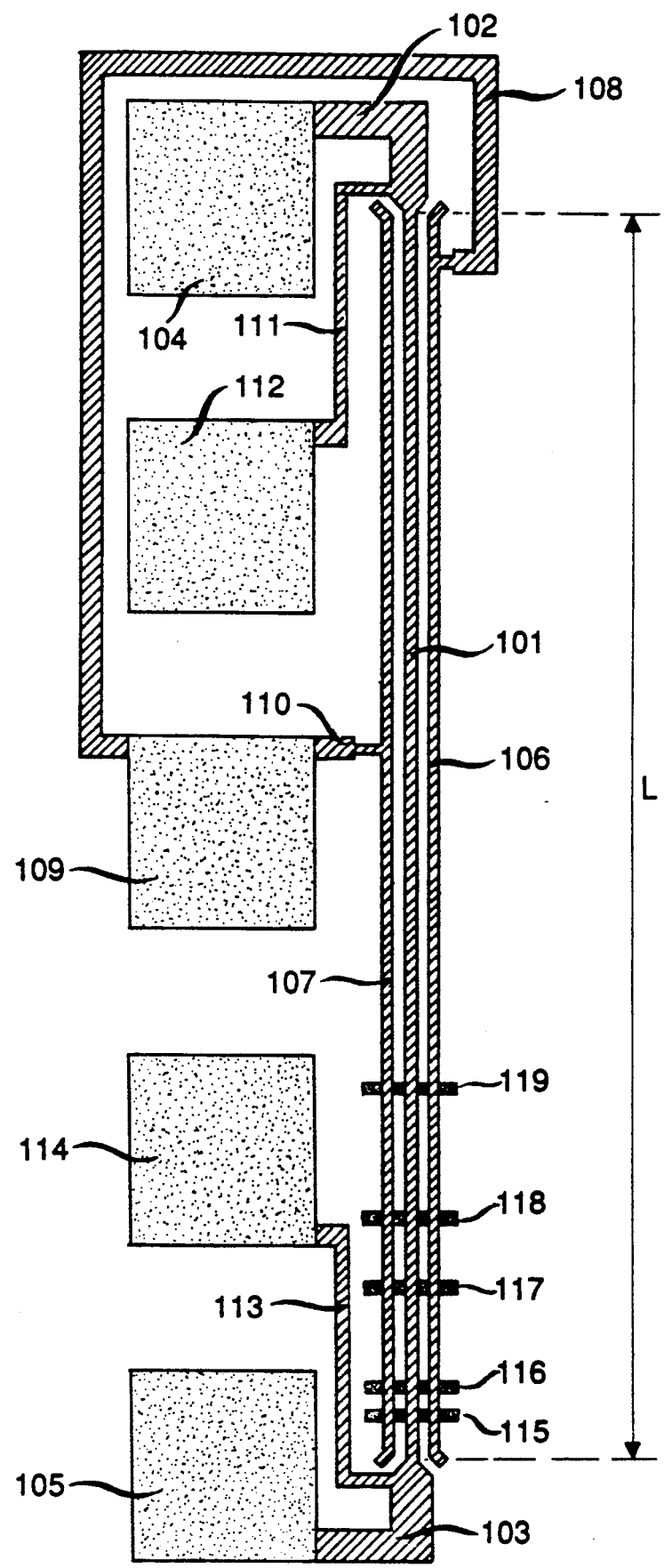
FIG. 1 shows an illustrative embodiment of the present invention.
Figure 2:
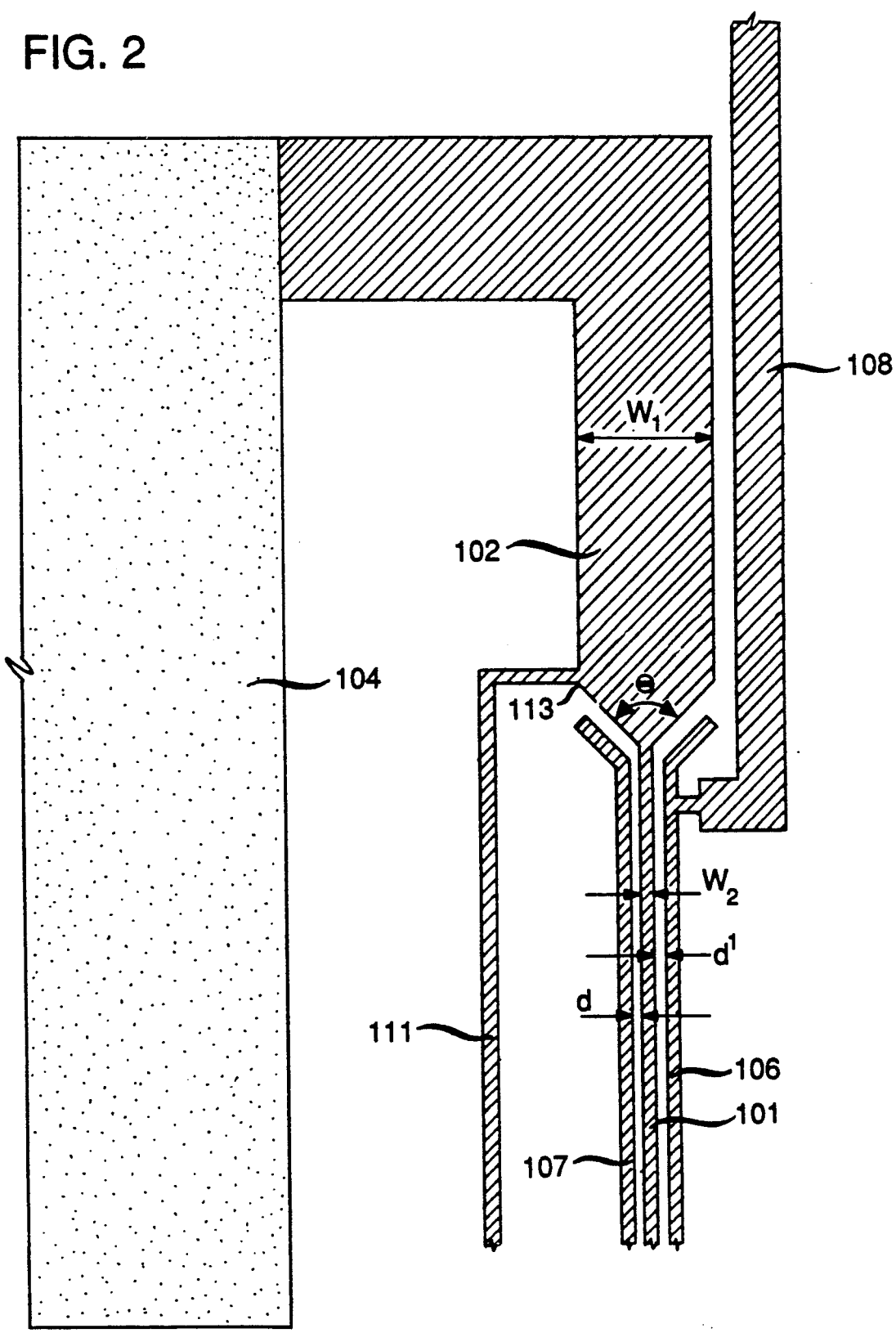
FIG. 2 shows a detail of the structure of FIG. 1

Referring to FIG. 1, an exemplary embodiment of the test structure used with the present technique is shown as formed on an integrated circuit wafer; a detail view of an end region is shown in FIG. 2. The test structure includes an elongated test conductor 101 that is contacted at both ends by broader end conductors 102 and 103, which conduct current from bond pads 104, 105 into the test conductor. The bond pads allow for electrical contact by test probes that conduct current from a source of current external to the integrated circuit wafer on which the test structure is formed. During a test according to one embodiment of the present technique, a current of at least $5 \times 10^6$ amps/cm$^2$, and typically greater than $1 \times 10^7$ amps/cm$^2$ is flowed through test conductor 101, and the time for failure determined. The failure typically occurs within minutes or seconds for these current densities, respectively. A "failure" is typically considered to occur when the test conductor 101 opens (becomes non-conductive), or shorts to an adjacent conductor, but other definitions are possible. For example, when the resistance of conductor 101 exceeds a given value (e.g., twice the initial resistance), a failure may be said to have occurred. This latter definition has the advantage that the current may be terminated before the metal test conductor opens or explodes, thereby reducing the contamination of the integrated circuit by metal debris.

The voltage drop along the test conductor may be measured from bondpads 112 and 114, which connect to the broader end conductors 102 and 103 via conductors 111 and 113, respectively. On either side of the test conductor 101 are optional side conductors 106 and 107, which connect to bondpad 109 via conductors 108 and 110. These optional side conductors, which are similar to those known in the prior art, allow for measurements of short circuits between the side conductors and the test conductor 101 that may occur due to the electromigration of metal from the test conductor. Such short circuits are considered another failure mechanism, and may be determined by measuring the resistance between bondpads 109 and 104, or else between bondpads 109 and 105. The optional side conductors 106 and 107 also serve to emulate minimum-spaced adjacent lines found in operational portions of the IC, and which might affect the patterning and definition of the test conductor.

We have determined that the length L of the test conductor should be at least 50 micrometers, to obtain valid test results. This relatively long length provides for a uniform and relatively gradual thermal gradient. In contrast, the SWEAT structure (FIG. 3) produces non-uniform, sharply-peaked thermal gradients, wherein bulk diffusion may produce the predominant electromigration effect. Surprisingly to workers in the art, the long, gradual thermal gradient, which reduces bulk diffusion effects, provides for test results that better correlate to long-term test results. We hypothesize that the long test conductor length of the inventive technique provides for the "electron wind" to be the predominant effect in determining electromigration. That is, the flow of negative electronic charge due to the test current tends to drag the metal atoms of the test conductor along with it. However, other explanations of the improved results of the present technique are possible. The width $W_2$ of the test conductor is typically equal to the minimum design width of the metal runners used on a given level of the integrated circuit. In commercial practice, this is less than 10 micrometers, and typically less that 5 micrometers.

As an option, topography features may be included underneath the test conductor which run generally transversely to the test conductor. These features, which are otherwise known in the art (FIG. 3), are typically conductors formed in a lower level than the test conductor, and separated therefrom by a dielectric layer. For example, runners 115 . . . 119 may be formed of a polysilicon (or silicide) gate conductor layer, or alternatively from a lower metal conductor level. The topography may also be stacked to produce extreme steps over which the test conductor must pass. These runners may be insulated from the test conductor by a deposited silicon dioxide (or doped glass) layer. The topography features are typically variably spaced, as shown. They provide information as to the worst-case failure conditions. That is, when the test conductor fails near a given topography feature, that location may be inspected to determine the quality of the metal coverage over that feature. Typically, thinning of the metal, or a change in the width of the metal, may be found due to step coverage problems, or lithography problems, associated with the given topography feature. (However, failure near a feature may not necessarily result solely from step coverage degradation).

It is often desirable to include two test structures on a given integrated circuit, for comparison purposes. That is, a first test structure can have topographic features located thereunder, whereas a second test structure is located on a planar dielectric surface. Differential measurements between the two test structures may then accurately determine parameters that are affected by the underlying topographical features. Such parameters may include resistance, resistance versus temperature, power versus temperature, and time to fail. A direct comparison is therefore possible that determines the geometry and thermal effects of a runner in a real circuit situation over topography versus an ideal planar test structure. For example, the relatively high sensitivity of differential measurements allows the determination of the incremental resistance change of the conductor over topography. This is especially useful in cases where a determination has been made that when the resistance ratio exceeds a specified value, the lifetime of the product is shortened. Therefore, a resistance ratio versus conductor lifetime pass/fail criterion may be used to control the processing conditions of the production line. The test currents may be flowed sequentially, or alternatively simultaneously through the two test structures. The differential measurements may likewise be performed either sequentially, or alternatively simultaneously. If desired, the currents may be flowed through both in a bridge circuit, where the two structures are arms of a four arm bridge.

Referring to FIG. 2, further details of the test structure are shown. The length L is typically about 800 micrometers, for providing results that may be most conveniently correlated with those of the traditional long-term test structure. The width $W_1$, of the broader end conductors is at least 5 times, and typically about 10 times, the width of the test conductor, $W_2$. This dimensional ratio provides for minimal voltage drop, and minimal electromigration, in the end regions. In addition, a tapered region between each of the colder end regions and the test conductor provides for a controlled thermal gradient, thereby minimizing thermal stress in the test conductor. A taper angle $\theta$ is defined by the sides of the tapered region as it narrows from the broader end regions into the test conductor region (101). The tapered region also provides for supplying the current while minimizing current crowding effects. In addition, note that the voltage test conductor (111) connects to the broader end conductor at the point (113) where the taper begins. This provides improved accuracy as compared to prior art techniques, which locate the voltage test conductor further away from the tapered region.

The information gained from the inventive test may be used to adjust processing conditions, as noted above. Typical process steps that may be affected include the dielectric deposition step for the dielectric on which the test conductor is formed. More commonly, the conductor-forming process itself is found to be closely correlated to the failure, and hence in need of adjustment. The thickness of the conductor, its linewidth (determined, for example, by lithography and/or etching processes), and its composition may all be adjusted. For example, when the conductor is aluminum, it may contain small amounts of silicon or copper, which amount may need to be increased or decreased. Similarly, the amount of gaseous constituents (e.g., nitrogen) used in the conductor deposition process may need to be altered, or a contaminant may be discovered and subsequently removed. If the conductor is a stacked metal conductor, for example aluminum on Ti, or TiW, still other conditions may be changed.

The above-noted processing changes may be accomplished on the wafer lot (about 25 to 50 wafers in a typical case) in which only a single wafer is tested. Alternatively, each wafer may be tested, and process adjustments made accordingly, due to the rapid nature of the test. In either case, the information gained by the inventive technique is likely to be of benefit to the entire production process, and all the IC chips therein. That is, the present invention enhances both the yield of integrated circuits, and also the reliability of the IC's. Hence, an economic advantage is gained for every integrated circuit produced, even if it is from a wafer that is not itself tested.

Although the inventive test structure has been described above in terms of its advantages for a rapid test at high current densities, it may alternately be used in a more traditional long-term type of test at lower current densities. In that case, the advantages include reduced electromigration failures due to the taper that connect the broader metal end regions to the elongated test conductor. In addition, the location of the voltage tap at the point where the taper begins reduces the measurement error due to voltage drop in the end regions, while still avoiding excessive thermal effects due to the heating of the test conductor. Furthermore, the inventive test structure may be provided for any of the metal levels on the integrated circuit. In that case, the width of the test conductor may be different for the different levels, as may be desirable due to the differing minimum linewidths of the different levels. It may even be used to test interconnects; that is, a long row of contact windows that connect one metal level to another, in what is referred to in the art as a "stitch pattern". All such uses are included herein.

We claim:

1. A method of making an integrated circuit including the step of determining the electromigration characteristics of an integrated circuit conductor by steps comprising flowing an electrical current through a test structure, and determining the time for a failure to occur, characterized in that the current density of said electrical current is at least $5 \times 10^6$ amps/cm$^2$, and said test structure comprises an elongated test conductor at least 50 micrometers long, wherein said elongated test conductor is contacted at its ends by wider metal conductors having a width at least 5 times the width of said elongated test conductor, and with said wider metal conductors tapering down to the width of said test conductor.

2. The method of claim 1 wherein the width of the wider metal conductors is about 10 times the width of said elongated test conductor.

3. The method of claim 1 wherein the current density of said electrical current is at least $1 \times 10^7$ amps/cm$^2$.

4. The method of claim 1 wherein said test conductor is about 800 micrometers long.

5. The method of claim 1 wherein said test structure further comprises voltage tap conductors that connect to each of said wider metal conductors at the point at which said wider metal conductors taper down to the width of said test conductor.

6. The method of claim 1 wherein said test structure further comprises elongated side conductors located on both sides of said test conductor and contacted by a bondpad.

7. The method of claim 1 wherein said test structure further comprises elongated topographic features located under, and oriented generally transverse to, said test conductor, wherein said elongated topographic features are formed of conductive material that is insulated from said test conductor.

8. The method of claim 1 further comprising the step of adjusting a parameter of a process step used in making said integrated circuit in response to information derived from said determining the electromigration characteristics of an integrated circuit conductor.

9. The method of claim 7 wherein said process step is a dielectric deposition process.

10. The method of claim 8 wherein said parameter is the thickness of said dielectric.

11. The method of claim 7 wherein said process step is a conductor forming process step.

12. The method of claim 10 wherein said conductor forming process step is a conductor deposition step.

13. The method of claim 10 wherein said conductor forming process step is a conductor etching step.

14. The method of claim 10 wherein said parameter is the thickness of said conductor.

15. The method of claim 10 wherein said parameter is the width of said conductor.

16. The method of claim 10 wherein said parameter is the composition of said conductor.

17. A method of making an integrated circuit including the step of determining the electromigration characteristics of an integrated circuit conductor,
characterized by steps comprising flowing electrical current through first and second test structures, and comparing the effect of the current flow on the structures, wherein said first test structure comprises elongated topographic features located under, and oriented generally transverse to, said test conductor, and said second test structure is located on a generally planar surface, and further
characterized in that each of said test structures comprise elongated test conductors at least 50 micrometers long, wherein said elongated test conductors are contacted at their ends by wider metal conductors having a width at least 5 times the width of said elongated test conductors, and with said wider metal conductors tapering down to the width of said test conductors.

18. The method of claim 17 wherein the current density of said electrical current is at least $5 \times 10^6$ amps/cm$^2$.

19. The method of claim 18 wherein said elongated topographic features are formed of conductive material that is insulated from said test conductor.

20. The method of claim 18 wherein said comparing includes comparing the resistance of the test conductor of said first test structure to the resistance of the test conductor of said second test structure during said flowing electrical current.

21. The method of claim 18 wherein said comparing includes comparing the time of failure of the test conductor of said first test structure to the time of failure of the test conductor of said second test structure.

22. A method of making an integrated circuit including the step of determining the electromigration characteristics of an integrated circuit conductor,
characterized by steps comprising flowing electrical current through an elongated test conductor at least 50 micrometers long, wherein said elongated test conductor is contacted at both ends by wider metal conductors having a width at least 5 times the width of said elongated test conductor, and with said wider metal conductors tapering down to the width of said test conductor.

23. The method of claim 22 wherein said elongated test conductor is about 800 micrometers long.

24. The method of claim 23 wherein elongated topographic features are located under, and generally transverse to, said test conductor.

25. The method of claim 24 wherein said elongated topographic features are formed of conductive material that is insulated from said test conductor.

26. The method of claim 22 wherein the width of said wider metal conductors is approximately 10 times the width of said elongated test conductor.

27. The method of claim 22 further comprising the step of measuring the voltage between voltage tap conductors that connect to each of said wider metal conductors at the point at which said wider metal conductors taper down to the width of said test conductor.

28. The method of claim 22 wherein said elongated test conductor has a width of less than 10 micrometers.

* * * * *